United States Patent [19]
Foster

[11] Patent Number: 6,082,954
[45] Date of Patent: *Jul. 4, 2000

[54] TAPE FEEDERS AND SYSTEMS USING THE SAME

[75] Inventor: Daniel Michael Foster, Garland, Tex.

[73] Assignee: Summit Holding Two, Inc.

[*] Notice: This patent issued on a continued prosecution application filed under 37 CFR 1.53(d), and is subject to the twenty year patent term provisions of 35 U.S.C. 154(a)(2).

[21] Appl. No.: 08/803,992

[22] Filed: Feb. 21, 1997

[51] Int. Cl.⁷ ..................................... B65H 20/22
[52] U.S. Cl. .......................... 414/416; 156/584; 414/403; 414/411; 226/157; 29/740
[58] Field of Search ..................... 414/403, 411, 414/416, 225; 226/158, 62, 157, 150, 8, 115; 29/740, 741, 759, 429.1; 53/453; 156/584, 541

[56] References Cited

U.S. PATENT DOCUMENTS

| | | | |
|---|---|---|---|
| 1,023,883 | 4/1912 | Scott | 226/157 |
| 3,476,299 | 11/1969 | Spiroch et al. | 226/157 X |
| 3,856,604 | 12/1974 | Lukkarinen | 226/157 X |
| 4,740,136 | 4/1988 | Asai et al. | 414/416 X |
| 4,768,915 | 9/1988 | Fujioka | 414/416 |
| 4,952,113 | 8/1990 | Fujioka | 414/416 |
| 5,299,902 | 4/1994 | Fujiwara et al. | 414/416 |
| 5,310,301 | 5/1994 | Aono | 29/740 X |
| 5,419,802 | 5/1995 | Nakatsuka et al. | 414/416 X |

FOREIGN PATENT DOCUMENTS

| | | | |
|---|---|---|---|
| 44-13865 | 6/1969 | Japan | 226/157 |
| 120799 | 4/1992 | Japan | 29/740 |
| 345092 | 12/1992 | Japan | 29/740 |

*Primary Examiner*—Frank E. Werner
*Attorney, Agent, or Firm*—James J. Murphy, Esq.; Winstead, Sechrest & Minkick

[57] ABSTRACT

A tape feeder 200 includes a sprocket 201 having a plurality of teeth 202 for engaging holes of a tape. A pawl 205 engages selected teeth of sprocket 201. A first lever 203 is coupled to pawl 205 and a second lever 204 is coupled to first lever 203 and a source 208 of a driving force. First lever 203 and second lever 204 operate by a toggle action to selectively engage pawl 205 with ones of teeth 202 and thereby index sprocket 201.

10 Claims, 5 Drawing Sheets

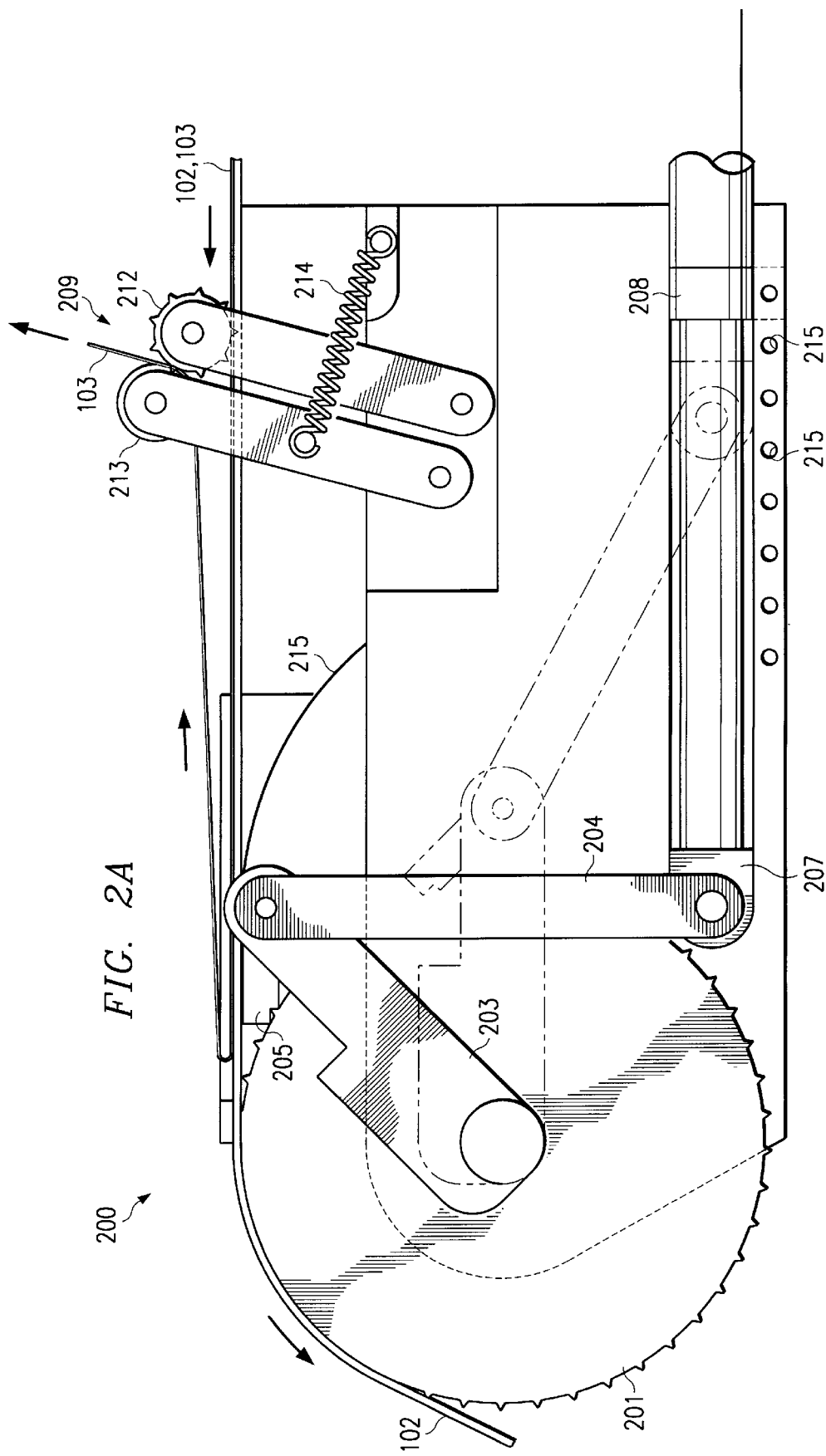

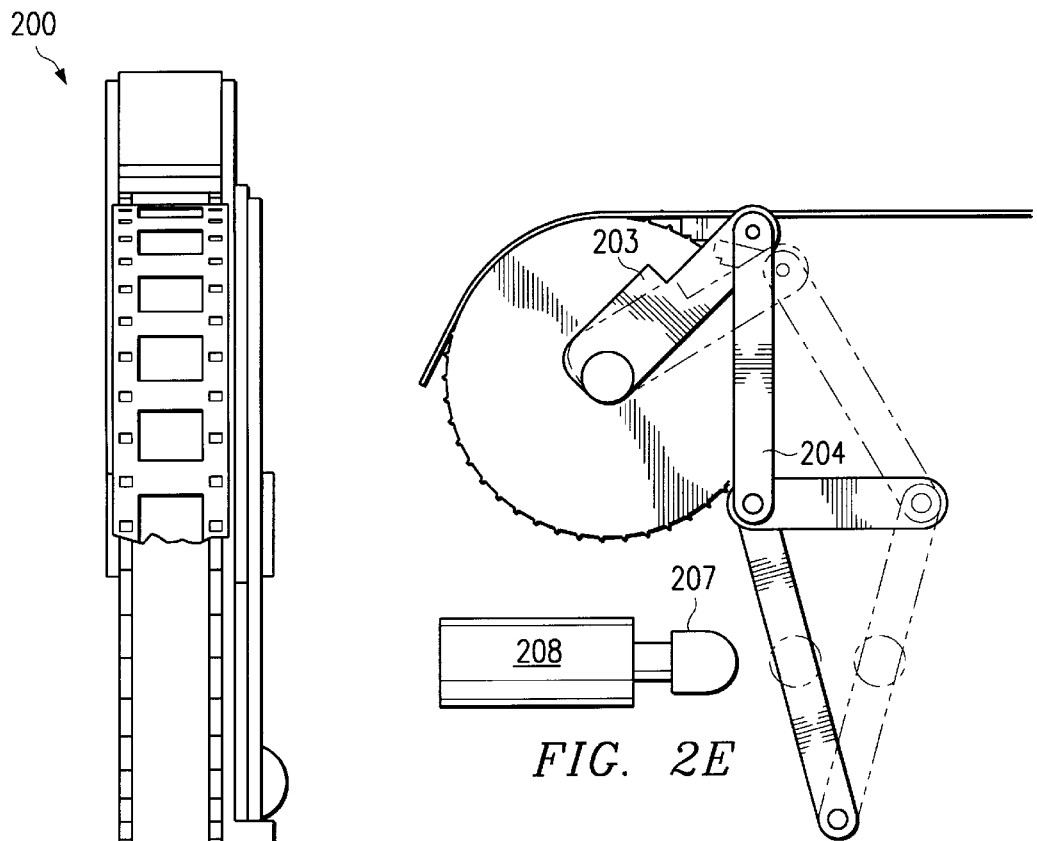
FIG. 2B
FIG. 2E
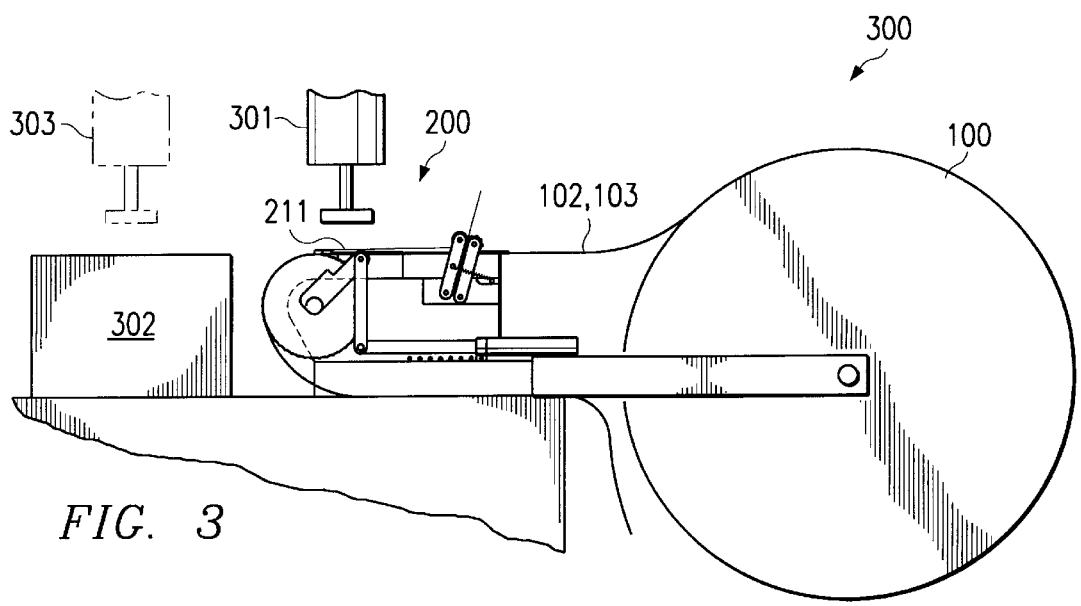
FIG. 3

TAPE FEEDERS AND SYSTEMS USING THE SAME

FIELD OF THE INVENTION

The present invention relates in general to manufacturing equipment and processes and in particular to tape feeders and systems using the same.

BACKGROUND OF THE INVENTION

Tape feeders are commonly used to feed parts to automatic and semi-automatic manufacturing equipment during product assembly and similar automated manufacturing processes. Generally, components required for a given process, for example electronic circuit board assembly, are stored on a carrier tape which is passed through the tape feeder to the host machine. The host machine then robotically removes the components from the tapes for use by the host machine in an assembly or testing step, for example. Hence, a relatively continuous stream of components can be efficiently supplied to the host machine.

Each carrier tape includes a series of pockets which hold a correspondingly sized component, which may vary from very small electronic components, such as integrated circuit chips and discrete devices, to larger electromechanical devices such as connectors. Each component may be held in its pocket by a sheet of cover tape which adheres along the length of the carrier tape. The tape assembly, with the components held within the pockets, is spooled on a reel for storage.

The tape feeder is fastened to the host machine, typically by bolts or a pre-fabricated base. The reel of tape containing the required parts is attached to either the feeder or the host machine. The feeder indexes the parts from the reel into a fixed position to allow the host machine to pick them up and place them in the work station. Typically, this is accomplished by indexing the tape a fixed amount and at the same time peeling back the cover tape to expose the parts current part in its pocket. Expended tape is routed to a collection points.

Designers of tape feeders must address a number of issues when designing a new machine. Among other things, size and weight must be considered; conventional tape feeders are relatively large and heavy. Further, some tapes are provided with sprocket holes for indexing, while others are not (which reduces tape costs). Additionally, in the typical case where cover tape is used, some mechanism must be provided for efficiently removing and disposing of the cover tape.

Thus, the need has arisen for tape feeder apparatus and systems. In particular, a mechanism is needed to feed small parts on pocketed carrier tape, such tape having sprocket holes along one edge but not necessarily having a sealed cover tape over the parts. Further, a mechanism is needed to feed parts on a pocketed carrier tape which does not have sprocket holes for indexing. In any event, the contemplated tape feeder should be compact, have a minimum number of moving parts and require few, if any, adjustments for proper operation.

SUMMARY OF THE INVENTION

According to a first embodiment of the principles of the present invention, a tape feeder is provided which includes a sprocket having a plurality of teeth for engaging holes of a tape. The tape feeder also includes a pawl for engaging selected ones of the teeth of the sprocket and first and second levers. The first lever is coupled to the pawl and the second lever coupled to the first lever and a source of a driving force, the first and second levers operating by toggle action to selectively engage the pawl with ones of the teeth and thereby index the sprocket.

According to another embodiment of the principles of the present invention, a tape feeder system is disclosed which includes a selected length of carrier tape having a plurality of pockets each for holding a component, a tape feeder, and robotics means for moving a component from the corresponding pocket of the tape when the pocket reaches a predetermined position. The tape feeder includes a sprocket having teeth for engaging index holes formed through the carrier tape and a toggle mechanism for indexing the sprocket to advance the tape. The toggle mechanism includes a pawl for applying a force to a selected tooth of the sprocket and first and second lever arms for coupling a force generated by an external source to the pawl.

According to an additional embodiment of the principles of the present invention, a tape feeder is provided for advancing a carrier tape having a plurality of pockets, the tape feeder receiving the carrier tape along with a cover tape disposed across an opening of at least some of the pockets. First and second rollers are included for receiving the cover tape therebetween. Drive means are provided for rotating at least one of the first and second rollers, the rollers stripping the cover tape from the carrier tape while substantially simultaneously advancing the carrier tape.

According to a further embodiment of the principles of the present invention, a tape feeder is provided which includes a length of tape supported on a reel, the tape including a carrier tape and a cover tape. A tape feeder is included for receiving the length of tape and stripping the cover tape from the carrier tape while simultaneously advancing the carrier tape in a single action. A host machine is provided for removing a component stored in a pocket of the carrier tape, the pocket having been advanced to a predetermined pick-up point by the tape feeder.

The principles of the present invention provide substantial advantages over the prior art. Among other things, these principles allow the construction and operation of tape feeders which are compact, have a minimum number of moving parts and require few, if any, adjustments for proper operation. In particular, the principles of the present invention provide for the implementation of a mechanism which feeds small parts on pocketed carrier tape, the carrier tape having sprocket holes along one edge but not necessarily having a sealed cover tape over the parts. The principles of the present invention further allow for the construction of a tape feeder which can feed parts on a pocketed carrier tape which does not have sprocket holes for indexing.

BRIEF DESCRIPTION OF THE DRAWINGS

For a more complete understanding of the present invention, and the advantages thereof, reference is now made to the following descriptions taken in conjunction with the accompanying drawings, in which:

FIG. 2A is a side view diagram of a tape feeder according to the principles of the present invention;

FIG. 2B is an end view of the tape feeder of FIG. 2A;

FIG. 2E is a diagram generally illustrating the operation of a pawl and sprocket assembly;

FIG. 3 is a side view diagram of a typical manufacturing system embodying the tape feeder of FIGS. 2A–2D;

DETAILED DESCRIPTION OF THE INVENTION

The principles of the present invention and their advantages are best understood by referring to the illustrated embodiment depicted in FIGS. 1–5 of the drawings, in which like numbers designate like parts.

Figure 1:
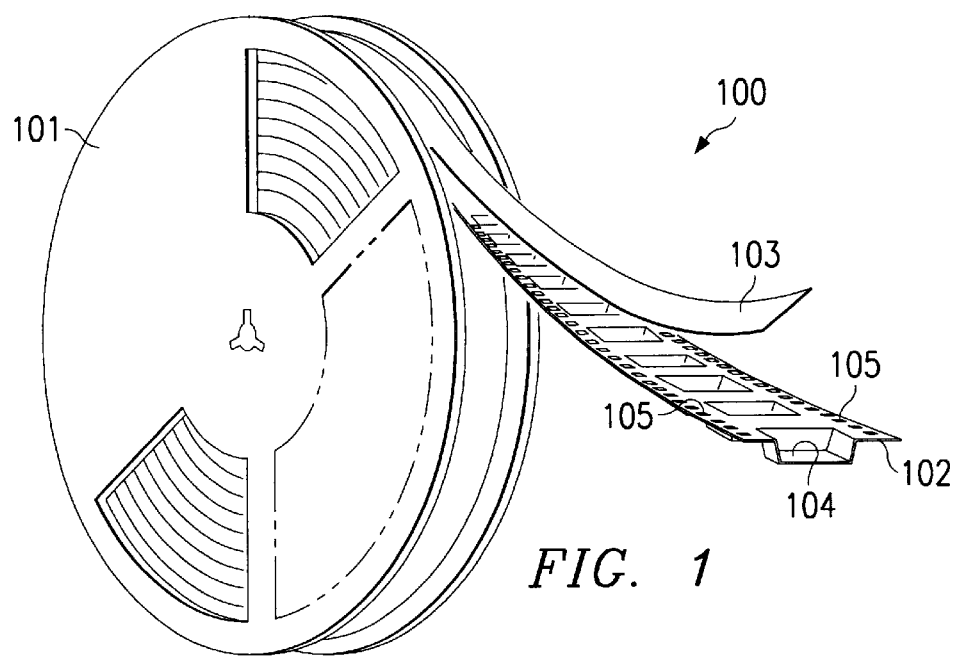
FIG. 1 is a diagram depicting a typical carrier tape-cover tape assembly stored on a reel or spool.

FIG. 1 is a diagram of a typical pocketed tape assembly 100, generally covered by industry standard EIA-481 recognized by those skilled in the art. Assembly 100 includes a reel or spool 101 maintaining a carrier tape 102 and the corresponding cover tape 103 held by adhesive to the upper surface of the carrier tape 102. It should be noted that in the illustrated embodiment, carrier tape 102 is 8 to 16 millimeters in width, although the width of carrier tape 102 will vary as a function of the actual application. In FIG. 1, a portion of cover tape 103 has been peeled-back to expose a number of pockets 104 in carrier tape 102. Pockets 104 hold the components to be fed to the host machine and vary in width, length and depth from application to application, depending on such factors as the size of the components as known in the art. In the illustrated embodiment, carrier tape 102 is shown with index holes 105 for indexing.

Figure 2C:
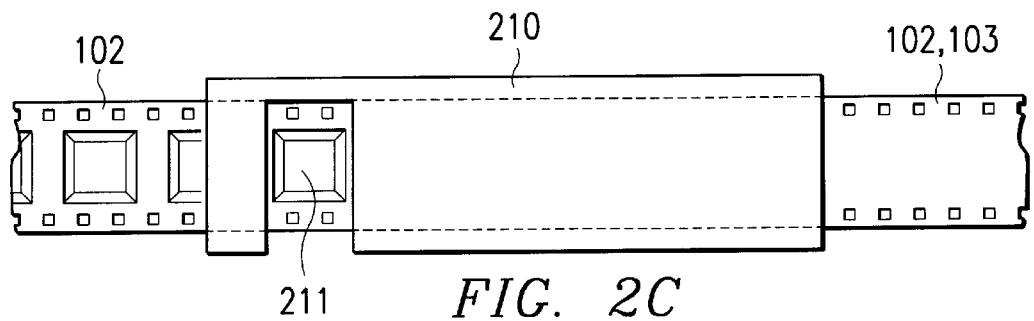
FIG. 2C is a top view of the tape feeder of FIG. 2A.
Figure 2D:
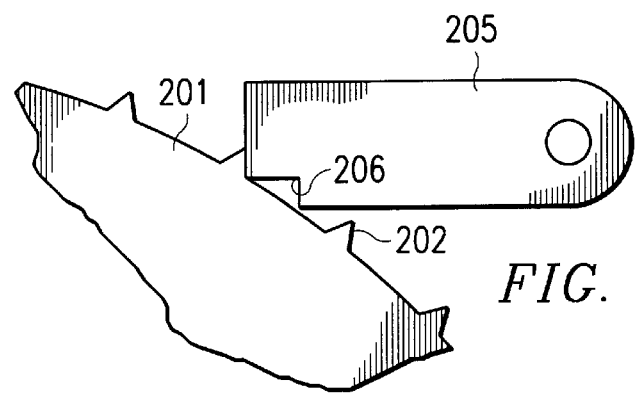
FIG. 2D is a more detailed diagram of the engagement of the pawl and sprocket of FIG. 2A.
Figure 4:
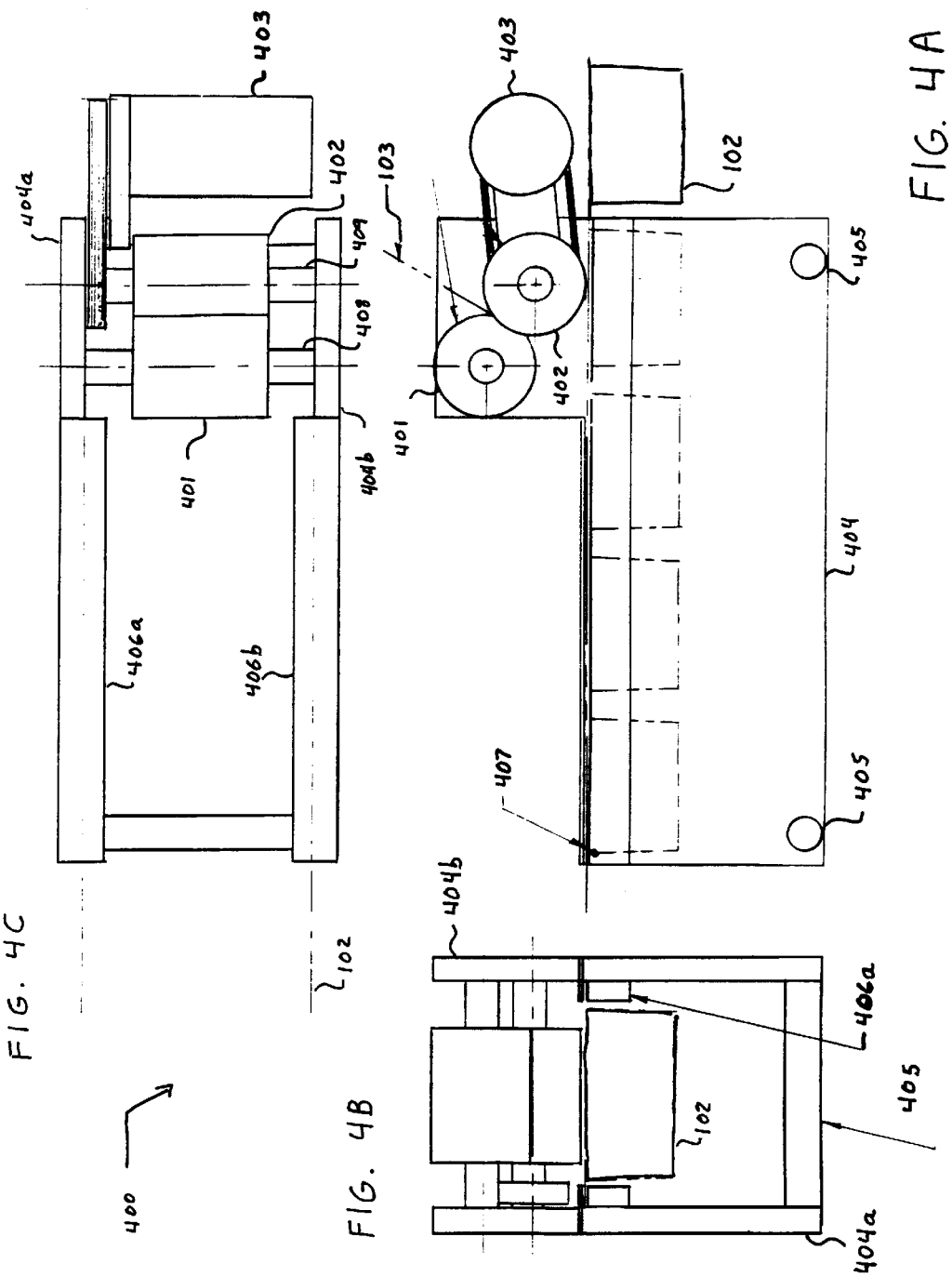
FIG. 4A is a side view diagram of a second tape stripper/feeder embodying the principles of the present invention.
FIG. 4B is an end view of the tape stripper/feeder of FIG. 4A.
FIG. 4C is a top view of the tape stripper/feeder of FIG. 4A.

FIGS. 2A–2D are a series if diagrams depicting a tape feeder 200 according to the principles of the present invention. In particular, FIG. 2A is a side view of FIG. 2B is an end view of and FIG. 2C is a top view of a portion of tape feeder 200. FIG. 2D is a more detailed diagram emphasizing the relationship between the index pawl and half-step notches on the sprocket shown in FIG. 2A. FIG. 2E illustrates a general method of driving a sprocket using an external force, such as that applied by an pneumatic cylinder.

Tape feeder 200 includes a drive sprocket 201 which includes a series of teeth 202. Preferably, sprocket 201 and in particular the number, size and spacing of teeth 202, are designed to match the index hole size and spacing of tape 102. In other words, sprocket 201 is designed such that sprocket (index) holes 105 of carrier tape 102 engage teeth 202 of sprocket 201 such that tape 102/103 advances (indexes) as sprocket 201 indexes.

Drive sprocket 201 is rotated in steps (indexed) by a pair of lever arms 203 and 204 and an index pawl 205 having which also engages teeth 202 of sprocket 201. In the preferred embodiment, index pawl 205 also includes a half step notch 206 allowing the mechanism to half step, or feed ½ the distance between index holes without a second wheel or sprocket. Levers 203 and 204, index pawl 205, and ultimately sprocket 201 are driven by a ram 207 pneumatically extended or retracted from an external cylinder 208 in the illustrated embodiment.

This linkage provided by arms 203 and 204 and pawl 205 is preferably of a toggle type which provides enough leverage to allow the use of small cylinders 208. Specifically, on the reverse stroke of ram 207, lever arms 203 and 204 retracts pawl 205 from the presently engage tooth 202. On the forward stroke of ram 207, pawl 205 engages a lower tooth on sprocket 201 and the applied force advances (indexes) sprocket 201 along with tape 102/103 by the distance of one tooth spacing. The toggle action provides a very smooth feed which slows down naturally at the end of the cylinder stroke. This feature advantageously helps prevent very small parts from being thrown out of their carrier tape pockets 104. It should be noted that the linkage can also be driven by external levers, on plungers, on the host machine. For half stepping with the half-step notch, cylinder 208 can be adjusted longitudinally relative to feeder 200 by a set of mounting holes 215. This allows the stroke of ram 207 to be shortened or lengthened and the indexing of sprocket 201 per stroke correspondingly shortened or lengthen.

After tape 102/103 advances under a cover 210, cover tape 103 is removed by a stripper mechanism 209. Cover tape stripping mechanism 209 is driven by the tape 102/103 itself such that no linkage is required between the sprockets. A small sprocket 212 is provided, the teeth of wheel 212 engaging cover tape 103. When cover tape 103 is fed forward by sprocket 201, sprocket 212 is driven by cover tape 103 while an upper wheel 213, spring loaded by a spring 214 against sprocket 212, pinches cover tape 103 thereby stripping cover tape 103 away from carrier tape 102 carrier tape 102 and cover tape 103 supported by tape support 215. The lack of linkage or belts between sprocket 201 and wheels 212/213 allows the system to be reconfigured easily. The simplicity of design also makes possible narrow embodiments of tape feeder 200. This allows more feeders to be put on a given host machine, better utilizing available space.

The component or part at the next exposed pocket of carrier tape 102 is made available for retrieval by the host machine at pick-up point 211. FIG. 3 illustrates the embodiment of tape feeder 200 in a typical host machine 300. Host machine 300 includes tape assembly 100 providing a feed of carrier tape 102 holding a required stream of components, along with cover tape 103. The tape feed is provided to tape feeder 200 which strips off cover tape 103 and provides an exposed component in its carrier tape pocket at the pick-up point 211. A robotic pick-up head 301 picks-up each components as it arrives at point 211 and provides it to workstation 302. At workstation 302, each component may, for example, be inserted into an assembly using a robotic head 303 or used for some other assembly or test purpose.

FIGS. 4A, 4B and 4C are respective, side, end and top views of a tape stripper/feeder 400 embodying the principles of the present invention. Stripper/feeder includes two rollers 401 and 402 powered by a motor and belt 403. A frame constructed of sidewalls 404 and spacers 404 supports rollers 401 and 402 and belt/motor 403. A pair of tape shelves 406a and 406b are provided to support carrier tape 102.

The incoming carrier tape 102/cover tape 103 is passed under roller 402. In the preferred embodiment, at least one roller 401/402 is a cylinder of a soft and durable material to allow rollers 401 and 402 to be pinched together firmly. This provides a good grip on cover tape 102 which is fed between them. Thus, when rollers 401 and 402 are rotated, cover tape 103 is peeled off and carrier tape 102 pulled along by the same force. Not only does this feature perform the cover tape stripping and carrier tape advancing operations in a single action, but also allows for the use of carrier tape 102 which does not include sprocket holes.

A sensor 407 detects the leading edge of the next pocket reaching the pick-up point and halts tape advancement so that the part can be removed. Feeding can be initiated either by an on board sensor to detect the part leaving that pocket or by the host machine. System 400 requires no set up or adjustments; index pitch is automatically controlled. Advantageously, since carrier tape 102 is supported on the edges by shelves 406, the depth of the carrier tape pockets does not matter. The feeder is sized for various widths of tape simply by using different lengths of spacers 405 and shafts 408 and 408 supporting rollers 401 and 402. In adjustable embodiments, sidewalls 404 may be slidable on rods of sufficient length. Due to the simplicity, the device can be configured easily for various applications, at a reduced manufacturing cost.

Figure 5:
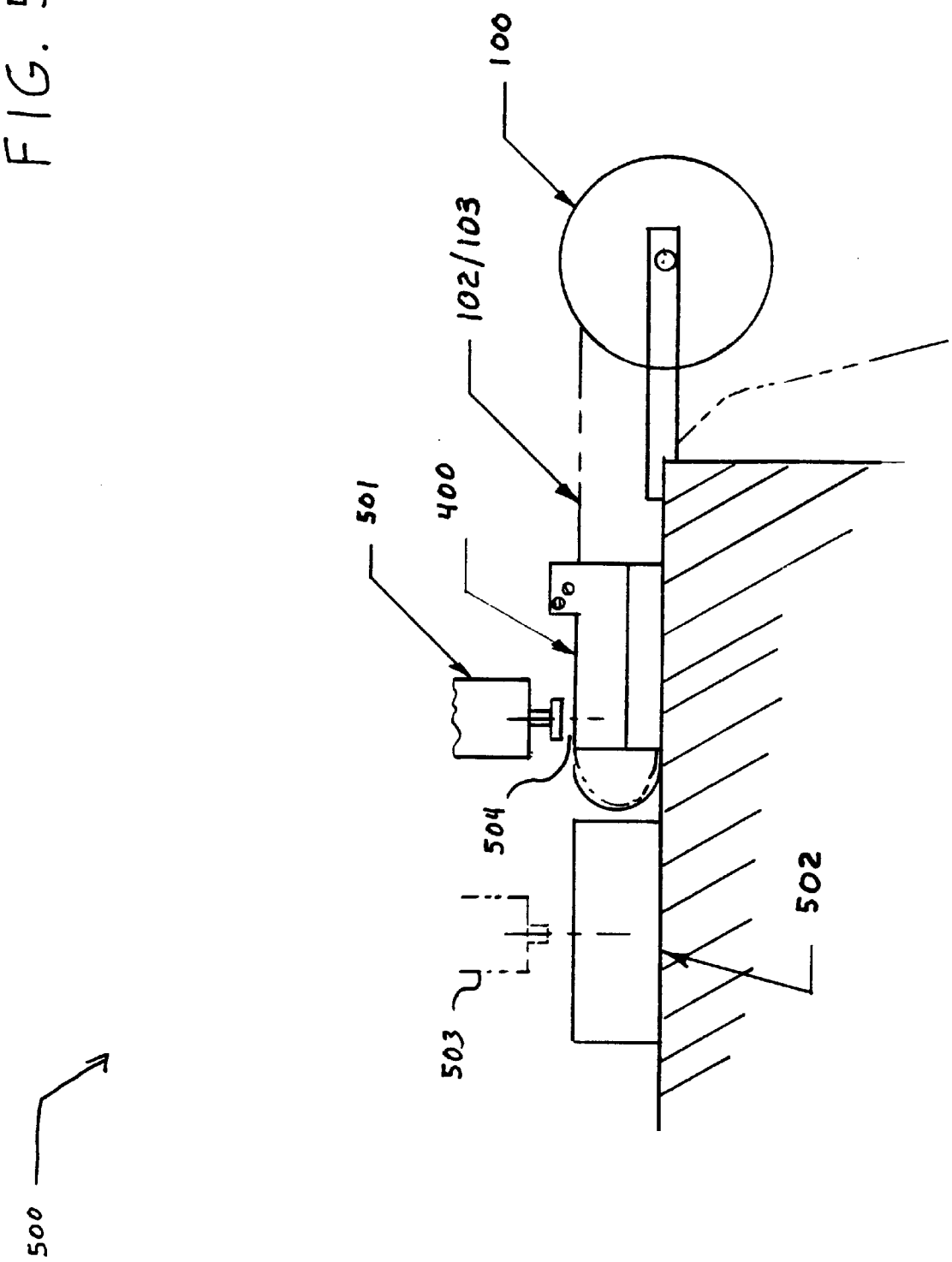
FIG. 5 is a side view diagram of a typical manufacturing system embodying the tape stripper/feeder of FIG. 4A.

FIG. 5 depicts a typical manufacturing system 500 employing tape stripper/feeder 400. System 500 includes tape assembly 100 providing a feed of carrier tape 102 holding a the desired components in the corresponding pockets, along with cover tape 103. The tape is received by tape stripper/feeder 200 which in the single action of rotating rollers 401 and 402 strips off cover tape 103 and advances the carrier tape 102. Sensor detects when an exposed component reaches the pick-up point 504. A robotic pick-up head 501 picks-up each components as it arrives at point 504 and provides it to workstation 502. Rollers 401 and 402 are again driven by motor 403 to advance carrier tape 103 until the next pocket reaches sensor 407. Workstation 302 uses each component retrieved by robotic head 501 as required. For example, a given component may be inserted into an assembly using a robotic head 503 or used for some other assembly or test purpose.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It is therefore, contemplated that the claims will cover any such modifications or embodiments that fall within the true scope of the invention.

What is claimed is:

1. A tape feeder comprising:
   a sprocket having a plurality of teeth for engaging holes of a tape and thereby advancing said tape during rotation of said sprocket;
   a pawl for engaging selected said teeth of said sprocket; and
   a first lever having a first end substantially fixedly coupled to said pawl such that said first end of said lever and said pawl move substantially in unison and a second lever having a first end pivotally coupled to said first end of said first lever substantially proximate the coupling of said pawl and said first end of said first lever and a second end pivotally coupled to a source of a driving force, said first lever having a second end pivotally coupled substantially at a center of said sprocket a longitudinal axis of said first lever moving from a first angle to a second smaller angle with respect to an axis of said feeder vertically bisecting said center of said sprocket in response to a movement of a longitudinal axis of said second lever from a third angle to a fourth smaller angle with respect to an axis of said feeder horizontally bisecting said center of said sprocket in response to said driving force to generate a toggle action to selectively engage said pawl with ones of said teeth and thereby smoothly index said sprocket.

2. The tape feeder of claim 1 wherein said source of a driving force comprises an external cylinder.

3. The tape feeder of claim 1 wherein said tape includes a carrier tape and cover tape for holding components within corresponding pockets disposed along a length of said carrier tape.

4. The tape feeder of claim 3 and further comprising cover tape stripper means for stripping said cover tape from said carrier tape.

5. The tape feeder of claim 4 wherein said tape stripper means comprises:
   a first wheel including teeth for engaging said cover tape;
   a second wheel opposing said first wheel for applying a force against said first wheel, said cover tape passing between said first and second wheels, said first and second wheels stripping said cover tape from said carrier; and
   wherein said tape stripper is driven by said cover tape without direct linkage to said sprocket.

6. The tape feeder of claim 1 wherein said source of a driving force comprises:
   a cylinder for applying said driving force to said levers through a ram; and
   means for adjusting a distance between an end of said ram and said second lever to adjust indexing of said sprocket.

7. The tape feeder of claim 6 wherein said pawl further includes a notch for indexing said sprocket by half steps.

8. A tape feeder system comprising:
   a selected length of carrier tape having a plurality of pockets each for holding a component;
   a tape feeder comprising:
      a sprocket having teeth for engaging index holes formed through said carrier tape and advancing said tape during rotation of said sprocket; and
      a toggle mechanism for indexing said sprocket to advance said tape, said toggle mechanism including a pawl for applying a force to a said tooth of said sprocket and first and second lever arms for coupling a force generated by an external source to said pawl, said first lever having a first end pivotally coupled substantially at a center of said sprocket and a second end pivotally coupled to a first end of said second lever and substantially fixedly coupled to said pawl proximate the coupling with the first end of the second lever such that said second end of said first lever and said pawl move substantially in unison, a longitudinal axis of said first lever moving from a first angle to a second smaller angle with respect to a vertical axis of said sprocket in response to a movement of said second lever from a first angle to a second smaller angle with respect to a horizontal axis of said sprocket in response to said force applied to a second end of said second lever; and
   robotic means for removing a said component from a corresponding said pocket when said pocket reaches a predetermined position.

9. The system of claim 8 wherein said length of tape is fed from a reel assembly.

10. The system of claim 8 and further comprising a cylinder for applying said force to said pawl through said first and second lever arms.

* * * * *